Figure 1:
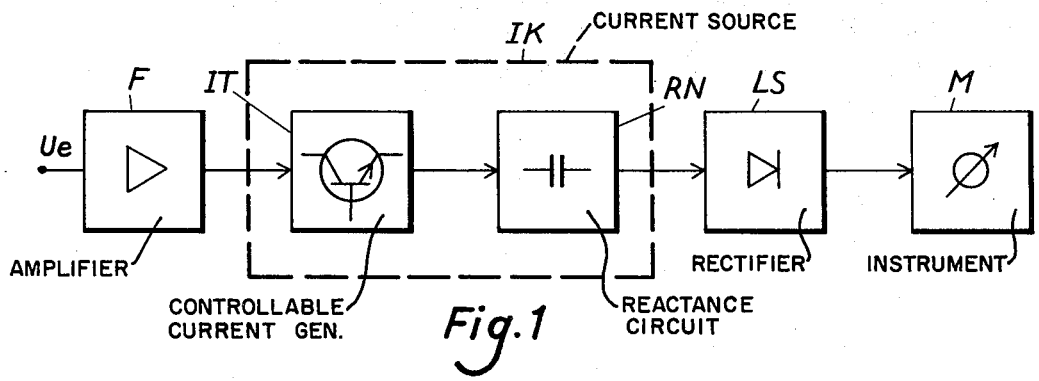

United States Patent [19]

Lofmark

[11] 3,938,040
[45] Feb. 10, 1976

[54] APPARATUS FOR MEASURING A SIGNAL VOLTAGE INCLUDING A CURRENT SOURCE WITH A CONTROL INPUT ON WHICH SAID SIGNAL APPEARS

[75] Inventor: Bengt Gustav Lofmark, Skarholmen, Sweden

[73] Assignee: Telefonaktiebolaget L M Ericsson, Stockholm, Sweden

[22] Filed: Mar. 22, 1974

[21] Appl. No.: 453,563

[30] Foreign Application Priority Data
Apr. 17, 1973 Sweden .......................... 73054124

[52] U.S. Cl. .................................. 324/119; 328/26
[51] Int. Cl.² ................... G01R 19/22; H02M 7/00
[58] Field of Search ............ 324/119; 328/26; 321/8

[56] References Cited
UNITED STATES PATENTS

| | | |
|---|---|---|
| 3,411,066 | 11/1968 | Bravenec .......................... 324/119 |
| 3,569,841 | 3/1971 | Richman ........................... 324/119 |
| 3,621,404 | 11/1971 | Sjogren ............................ 324/119 |
| 3,631,342 | 12/1971 | McDonald ......................... 324/119 |

OTHER PUBLICATIONS

Radio Mentor; heft 1; 1965; pp. 41–42.

*Primary Examiner*—John Kominski
*Assistant Examiner*—Ernest F. Karlsen
*Attorney, Agent, or Firm*—Hane, Baxley & Spiecens

[57] ABSTRACT

The present invention relates to an apparatus for measuring the level of a signal voltage supplied to the control input of a controllable constant current source whose output is connected to a phase inverting circuit conducting in one direction and to a rectifier conducting in the opposite direction so that a full-wave rectified current is obtained which is adapted to flow through a measurement device in order to obtain a measure of the voltage level.

3 Claims, 2 Drawing Figures

U.S. Patent  Feb. 10, 1976  3,938,040

APPARATUS FOR MEASURING A SIGNAL VOLTAGE INCLUDING A CURRENT SOURCE WITH A CONTROL INPUT ON WHICH SAID SIGNAL APPEARS

The present invention relates to an apparatus for measuring a signal voltage including a current source with a control input on which the signal appears. More particularly, the invention relates to a measuring device which includes a rectifier arrangement which is connected to the current source, and to a load measuring instrument or a level discriminator.

In for example, the carrier frequency techniques it is often required, with high precision, to be able to measure the level of a sine-wave signal, for example a pilot signal, the frequency of which can vary within wide limits. The principle of the measurement is such that whose signal, the level is to be measured, is supplied to a controllable current source which on its output delivers a current of the same form as the incoming signal with the value of the current being independent of possible variations in the subsequent load. This current is rectified and the rectified average value is measured by an instrument connected to the rectifier. Such a measuring principle is described in "Cables et Transmission" No. 4, 1970 pp. 340–349. In that connection, both voltage rectification and current rectification are used. The drawback with voltage rectification is that the rectifier is more temperature dependent and has bad linearity because of to the forward voltage drop of the included diodes. With current rectification these drawbacks are partly avoided, but the current rectifier demands, in contrast to the voltage rectifier, more components, as for example, capacitors.

In, for example, the article "Mittelwergleichrichtung in batteriegespeisten Transistorschaltungen" in "Radio Mentor" 1965, Heft 1, pp. 41–42 a testing device of above mentioned kind is shown which utilizes a constant current source having a very high output impedance for alternating current. The drawbacks with this circuit is, however, that only half-wave rectification is obtained and that the rectified output voltage is considerably less than the supplying voltage.

An object of the present invention is to provide an apparatus for measuring the level of an incoming signal voltage wherein a current corresponding to the signal voltage is full wave rectified and in which practically the entire supplying voltage is available on the output of the apparatus.

Figure 2:
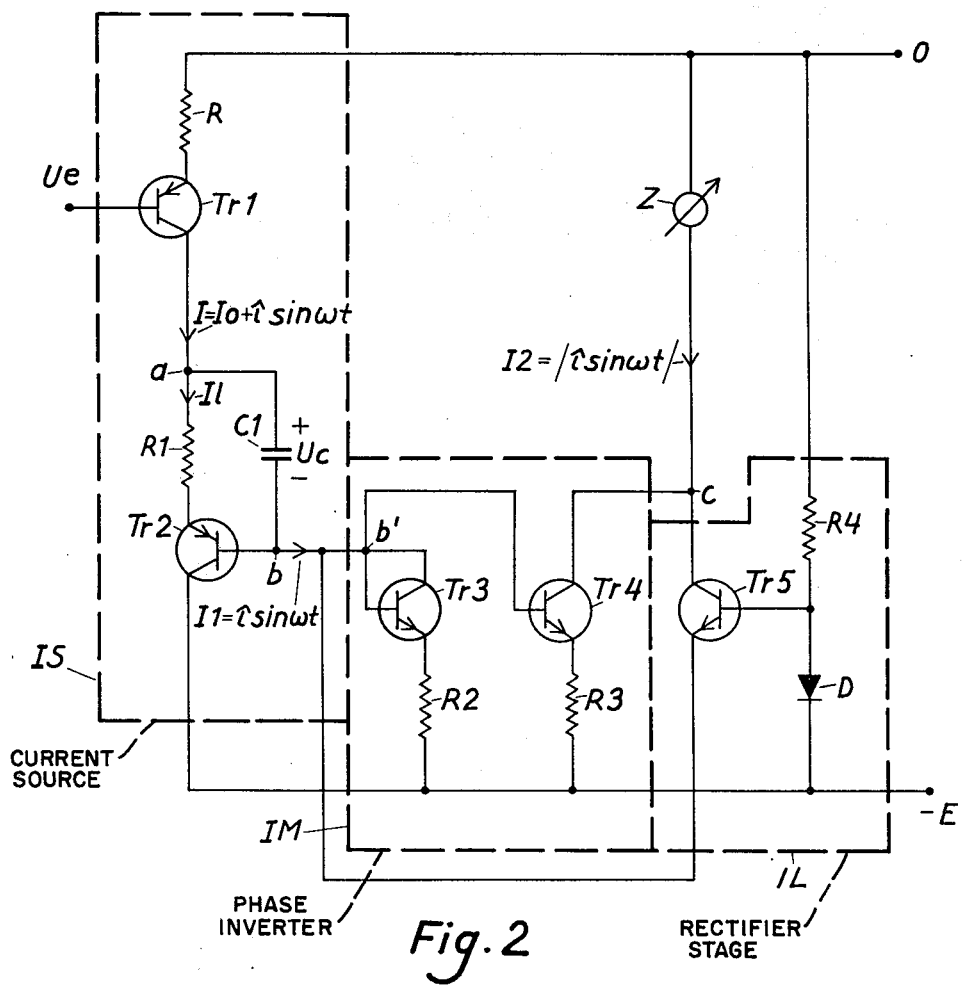

The invention, the characteristics of which appear from the appended claims, will be described more in detail with reference to the accompanying drawing in which:

FIG. 1 shows a block diagram for illustrating the above mentioned principle of measuring; and FIG. 2 shows a circuit diagram for the apparatus according to the present invention.

In FIG. 1 a block diagram is shown, which illustrates the known principle for measurement of the level of an incoming signal Ue, for example, the pilot signal in a carrier frequency system. The signal Ue is supplied to an amplifier F of suitable type whose the output is connected to the control input of a controllable current generator IT. This current generator consists suitably of common emitter transistor amplifier having a reactance circuit RN connected to its output. This a current source IK is obtained which for alternating voltages within a certain frequency range shows a very high internal impedance. On the output of the circuit RN a current appears whose amplitude and frequency depend on the incoming signal and which is essentially independent of the variations in the subsequent load. This load consists of the rectifier LS which rectifies the current from the current source IK and a measuring instrument M which measures its rectified mean value. A measure is thus obtained of the signal level of the incoming signal Ue. Owing to the high output impedance of the current source IK linearity errors and temperature dependence of the rectifier LS can be kept low.

The rectifier arrangement according to the present invention is constructed essentially according to the same principle as according to FIG. 1 but includes one capacitor this and, in contrast to the known arrangement, can be used for half-wave as well as for full-wave rectification. Thus also precise measurement of signals with low frequency can be carried out. With reference to FIG. 2 an embodiment of the invention will be described more in detail.

The reference IS designates a current source, corresponding to the block IK in FIG. 1, having an input which received the signal Ue whose level is to be determined. It is assumed that the signal Ue is a sine-wave, that is, Ue = û$_e$ sin Ω.t. The current source IS includes a common emitter connected transistor stage operating as a current generator comprising the transistor Tr1 and the associated emitter resistor R. The collector of the transistor Tr1 is connected via point a to a transistor stage functioning as an operating impedance and comprising the transistor Tr2, the resistor R1 and the capacitor C1. The operating impedance is in this connection and in a known manner intended to give a high output impedance for the alternating current from the current generator Tr1, R at the output, point b. In the point a the current I = Io + î sin Ω.t. appears consisting of a direct current component Io and an alternating current component î sin Ω.t., having a frequency which is the same as the input signal Ue and an amplitude determined by the amplitude of the measuring signal. In the point b, a pure alternating current appears due to the coupling capacitor C1. To the point b a phase inverting circuit IM conducting in one current direction is connected comprising the transistor Tr3, Tr4 together with the associated emitter resistors R2, R3. The resistance of the resistors R2 and R3 is in that connection equal.

The reference c denotes the output of the circuit IM which is, on the one hand, connected to the load Z, and on the other hand connected to the output of a rectifier stage IL consisting of the transistor Tr5, the diode D and the resistor R4. The emitter of the transistor Tr5 is connected directly to the point b'. The reference −E denotes the potential of the supplying voltage source relatively ground 0. The phase inverting circuit IM has the property that when a current of predetermined polarity, in the present case of positive polarity, flows to input b', an equivalent current flows to its output c, while for the opposite polarity the current to the input b' is blocked.

The input b' of the circuit IM is connected to the output b of the current source IS which output is formed by the connection point between the one plate of the capacitor C1 and the base of the transistor Tr2. Thus the capacitor C1, not only serves as a reactance in the operating impedance, but also serves as a coupling capacitor in order to block the direct current component Io of the current I from the constant current generator Tr1, R. In principle it would be possible to choose the point *a* as an output from the current source IS to the subsequent phase inverting circuit IM, whereby a very small alternating current flows through the capacitor C1 and the voltage drop across the capacitor thereby could be neglected. This would imply the advantage that the transistor Tr2 would only load the output to a negligible extent. In the present case, however, the point b is chosen as output for the current source IS so that, as mentioned above, the capacitor C1 also can be utilized as a coupling capacitor. The voltage drop Uc which hereby arises across this capacitor, certainly gives rise to a leakage current I1=Uc/R1 through the transistor Tr2. This current, however, can be made small if the resistor R1 is chosen sufficiently great relative to the value of the capacitance of the capacitor C1 and the frequency $\Omega$ of the incoming signal. If, for example, the product $\Omega$. R1.C1 is chosen > 10 the measure fault is less than 0.5 percent.

To the phase inverting circuit IM the alternating current component $I1 = \hat{i} \sin \Omega.t.$ is thus fed and for its positive half period an equivalent current $I2 = \hat{i}.\sin\Omega.t/$ is obtained on the output c. In order to obtain full-wave rectification, a rectifier stage comprising the transistor Tr5, the resistor R4 and the diode D is connected to the ouput c. This stage conducts in the direction in which the phase inverting circuit IM is blocked. For the negative half period of I2, the transistor Tr4 is blocked and the current will flow from the point c through the collector-emitter circuit of the transistor Tr5 to the point b. The diode D connected between the base of the transistor Tr5 and the negative terminal −E is provided to compensate for the base-emitter voltage drop of the transistor Tr5, so that the point b momentarily is never lower than the supply voltage −E. Hence that the transistor Tr2 operates in its linear range which is necessary in order to obtain a high output impedance in the point b.

The base current which flows to the transistors Tr2 and Tr5 can be very small, approximately 200 times less than the corresponding collector-emitter current. Consequently its influence on the currents I1 and I2, respectively is negligible.

As the voltage drop across the transistor Tr4 and the associated emitter resistor can be made small, expressed as a percentage, compared with the supply voltage −E, the major part of this supply voltage is available across the laod Z which consists of the mean value indicating instrument or the level detector.

By replacing the phase inverting circuit IM by a diode connected to the point *b* and through the load to the potential −E and to exclude the rectifier stage IL, half-wave rectification can be obtained.

The rectifier arrangement is not limited to the above described embodiment comprising transistors but also integrated circuits can be used. Thus the phase inverting circuit IM can form an integrated circuit whereby the point *c* can assume a potential which more closely follows up the supply voltage −E, than in the case of discrete components. The available voltage across the impedance Z can thereby be higher than when the phase inverting circuit includes transistors.

We claim:

1. An apparatus for measuring the voltage of a signal which is substantially sinusoidal comprising a source of operating voltage having first and second output terminals, first and second transistors each having emitter, collector and base terminals, a first resistor connecting the emitter terminal of said first transistor to the first output terminal of said source, the base terminal of said first transistor being adapted to receive signals to be measured, means for connecting the collector terminal of said second transistor directly to the second output terminal of said source, a second resistor connecting the collector terminal of said first transistor to the emitter terminal of said second transistor, a capacitor connecting the collector terminal of said first transistor to the base terminal of said second transistor, a current indicating means having one terminal connected to one of the output terminals of said source and having another terminal, phase inversion means having an input connected to the base of the second transistor and an output connected to the another terminal of said current indicating means, first unidirectional current conducting means having one terminal connected to the another terminal of said current indicating means and having a second terminal, and nonreactive means for directly connecting the second terminal of said first unidirectional current conducting means to the base terminal of said second transistor.

2. The apparatus of claim 1 further comprising a second unidirectional current conducting means connected between the base terminal of said second transistor, and the junction of said current indicating means and said first unidirectional current conducting means.

3. The apparatus of claim 1 wherein said first unidirectional current conducting means comprises a further transistor having a collector terminal connected to said current indicating means, an emitter terminal connected to the base terminal of said second transistor and a base terminal connected to one of the output terminals of said source.

* * * * *